United States Patent [19]

Sagawa et al.

[11] Patent Number: 4,814,944
[45] Date of Patent: Mar. 21, 1989

[54] MOUNTING STRUCTURE FOR SURFACE MOUNTED TYPE COMPONENT WITH PROJECTION EXTENDING DOWN FROM LOWER SURFACE THEREOF AND METHOD OF MOUNTING A SURFACE MOUNTED TYPE COMPONENT ON A PRINTED CIRCUIT BOARD

[75] Inventors: Hiroyuki Sagawa, Takatsuki; Hirofumi Koga, Kyoto; Shunichi Agatahama, Mishima; Hideyuki Okumura, Takatsuki; Kazushige Matsuoka, Kyoto; Ryuichi Sato, Kyoto, all of Japan

[73] Assignee: Omron Tateisi Electronics Co., Tokyo, Japan

[21] Appl. No.: 220,433

[22] Filed: Jul. 13, 1988

Related U.S. Application Data

[63] Continuation of Ser. No. 886,224, Jul. 16, 1986.

[30] Foreign Application Priority Data

Aug. 14, 1985 [JP] Japan .............................. 60-125405[U]
Nov. 18, 1985 [JP] Japan .............................. 60-176989[U]

[51] Int. Cl.$^4$ .............................................. H05K 7/10
[52] U.S. Cl. ................................................... 361/403
[58] Field of Search ........................ 361/403, 417, 418

[56] References Cited

U.S. PATENT DOCUMENTS

| 3,649,950 | 3/1972 | Gluntz | 361/403 |
| 3,684,817 | 8/1972 | Card, Jr. et al. | 361/403 |
| 4,339,785 | 7/1982 | Ohsawa | 361/403 |

FOREIGN PATENT DOCUMENTS 3231556 4/1984 Fed. Rep. of Germany.
8325716 4/1987 Fed. Rep. of Germany.
2014791 8/1979 United Kingdom.

OTHER PUBLICATIONS

Hitachi Seisakusho K. K., Japanese Patent Abstract No. 60-68641, vol. 9, No. 204, 4/19/85.
Mitsubishi Denki K. K., Japanese Patent Abstract No. 60-12716, vol. 9, No. 126, 5/31/85.
Rice, "VLSI Packaging Environment", *Digest of Papers*, Feb. 23-26, 1981.

*Primary Examiner*—Roy N. Evall, Jr.
*Attorney, Agent, or Firm*—Wegner & Bretschneider

[57] ABSTRACT

In this mounting structure and method for a surface mounted type electronic component, the component has at least one terminal which protrudes from its bottom surface and which terminates in a foot portion for being soldered to a printed circuit board. Also, a projection extends from this bottom surface of the electronic component for a distance somewhat less than the amounty by which the terminal projects from it. This projection is provisionally secured by adhesive to the printed circuit board with the foot portion of the terminal overlaying that circuit portion to which it is to be soldered, and then subsequently this terminal foot portion is soldered to this circuit portion. Thereby, during the soldering process, there is no risk of the terminal foot portion becoming displaced from the circuit portion and thus badly soldered thereto, because of the locating action of the adhered projection. The projection may extend from a central portion of the bottom surface of the component, or may be provided in plurality as extending from central portions of edges of said bottom surface. And the end of the projection may be roughened.

17 Claims, 5 Drawing Sheets

MOUNTING STRUCTURE FOR SURFACE MOUNTED TYPE COMPONENT WITH PROJECTION EXTENDING DOWN FROM LOWER SURFACE THEREOF AND METHOD OF MOUNTING A SURFACE MOUNTED TYPE COMPONENT ON A PRINTED CIRCUIT BOARD

This application is a continuation of U.S. application Ser. No. 886,224, filed July 16, 1986.

BACKGROUND OF THE INVENTION

The present invention relates to a structure for mounting a component to a printed circuit board and to a method for doing the same, and more particularly relates to such a mounting structure and such a mounting method which are particularly adapted for aiding with the mounting of a so called surface mounted electronic component to a printed circuit board.

In recent times, the mounting of electronic parts to printed circuit boards according to the so called surface mounting technique has come more and more into favor; this is because of the lowering of cost provided with such a technique, and because of the convenience provided thereby. Further, as a refinement of such a surface mounting system, the so called double surface mounting technique in which electronic components are mounted to both the sides of a single printed circuit board has also started to come into vogue; this double surface mounting technique provides further convenience and lowering of cost, and allows beneficial increase of the density of electronic components upon the printed circuit.

In more detail, as shown in illustrative side view in FIG. 6 of the accompanying drawings, an electric component generally designated as 41 typically has terminals 42 which, for surface mounting, are typically bent through right angles so as to be constituted as leg portions 42a and foot portions 42b. And the foot portions 42b are typically soldered to portions 44 of a printed circuit pattern formed on a printed circuit board 43. This soldering of the terminal foot portions 42b to the printed circuit portions 44 is typically performed by coating solder paste over said printed circuit portions 44, then placing the foot portions 42b of the terminals 42 against said solder paste coated printed circuit portions 44 so that the electronic component 41 is at least somewhat held in place thereby at a typical distance such as shown by A1 in the figure from said printed circuit board 43, and then passing the whole assembly through a heating oven so as to melt the solder paste and so as to bond said terminal foot portions 42b to said printed circuit portions 44. In fact, typically, a considerable number of electronic components such as 41 are fixed to the printed circuit board 43 at the same time in this manner, with one pass through the heating oven being performed.

However, this type of mounting structure, and this mounting method, are prone to problems, as follows. First, since the vertical distance A1 from the bottom of the electronic component 41 (the portion thereof closest to the printed circuit board 43) to said printed circuit board 43, is typically quite greatdue to the typically considerable length of the terminal leg portions 42a, thereby the stability of the electronic component 41 is not very good, and the center of gravity thereof is rather far from the printed circuit board 43. Accordingly, during the soldering process, at which time any adhesive effect provided by the solder paste holding the terminal foot portions 42 to the printed circuit portions 44 is inevitably substantially released, there is a great risk that the electronic component may undesirably become displaced from its position with the terminal foot portions 42 in contact with the printed circuit portions 44, and this can cause poor connection between these elements, since in such a case said terminal foot portions 42 will come away from contact with said printed circuit portions 44 and not be properly soldered thereto.

As an expedient to cope with the above identified problems, it might be considered to provisionally bond the lower surface of the casing of the electronic component 41 to the printed circuit board 43, but this is not practicable with the construction as shown in FIG. 6, since the distance A1 is typically too great for such bonding.

Alternatively, as another expedient to cope with the above identified problems, it might be considered to shorten the length of the terminal leg portions 42a, as shown exemplarily in illustrative side view in FIG. 7 of the accompanying drawings, so as to reduce the vertical distance from the bottom of the electronic component 41 to the printed circuit board 43 to a distance such as shown by A2 in that figure. However, this expedient is fraught with other problems. Namely, first, if the distance from the component 41 to the printed circuit board 43 is so reduced, the problem arises that poor heat dissipation may occur. Furthermore, since in this case the terminal leg portions 42a are so short, it may happen that thermal stress and deformation which may be set up, when the apparatus is being used and the electronic component 41 is generating heat, due to difference between the coefficients of thermal expansion of the casing of said electronic component 41 and of the printed circuit board 43, cannot be properly absorbed. Such thermal stress and deformation, in the worst case, may lead to such force being exerted on the portions 44 of the printed circuit pattern on said printed circuit board 43, that said printed circuit portions 44 become peeled away from the base circuit board 43, and may further become fractured and interrupted. This could lead to failure of the assembly as a whole. Such thermal stress and deformation could also lead to cracking or fracture of the electronic component 41 itself.

Further, the above outlined problem of dissociation that may arise in the case of mounting such an electronic component to such a printed circuit base board is exacerbated in the case of the above described double surface mounting technique in which electronic components are mounted to both the sides of a single printed circuit board, because if the foot portions of the terminals of such components are provisionally attached to both sides of the printed circuit base board, only by solder paste as outlined above, it is almost inevitable that some of the components on the one side or the other of the printed circuit base board will be improperly attached, due to the fact that at least one side of the printed circuit base board cannot be face up.

SUMMARY OF THE INVENTION

Accordingly, it is the primary object of the present invention to provide a mounting structure for a surface mounted type electronic component, and a method for mounting a surface mounted type electronic component, which are able to overcome the problems detailed above with regard to the prior art.

It is a further object of the present invention to provide such a mounting structure for a surface mounted type electronic component, and such a method for mounting a surface mounted type electronic component, which are capable of guaranteeing good and reliable connection of the terminal portions of the electronic component to a printed circuit base board, without any risk of poor attachment of said terminal portions.

It is a further object of the present invention to provide such a mounting structure for a surface mounted type electronic component, and such a method for mounting a surface mounted type electronic component, which allow of provisional fixing in place of the electronic component to a printed circuit base board, before final soldering of the terminals thereof to printed circuit portions thereon.

It is a yet further object of the present invention to provide such a mounting structure for a surface mounted type electronic component, and such a method for mounting a surface mounted type electronic component, which ensure that neither the electronic component, nor the printed circuit on the base board nor the base board itself, are particularly subjected to undue stress or deformation.

It is a yet further object of the present invention to provide such a mounting structure for a surface mounted type electronic component, and such a method for mounting a surface mounted type electronic component, which allow for good heat dissipation.

It is a yet further object of the present invention to provide such a mounting structure for a surface mounted type electronic component, and such a method for mounting a surface mounted type electronic component, which are suitable for use in the case of fixing such surface mounted type electronic components to both sides of a printed circuit base board.

It is a yet further object of the present invention to provide such a mounting structure for a surface mounted type electronic component, and such a method for mounting a surface mounted type electronic component, which contribute to compactness of and low profile construction for the electronic component itself.

According to the most general structure aspect of the present invention, these and other objects are attained by a mounting structure for a surface mounted type electronic component, said component including at least one terminal protruding from a bottom surface thereof and terminating in a foot portion for being soldered to a printed circuit board, comprising a projection extending from said bottom surface of said electronic component for a distance somewhat less than the amount by which said terminal projects from said bottom surface; and optionally the end portion of said projection may be roughened. Optionally, said projection may extend from a central portion of said bottom surface of said electronic component; or alternatively a plurality of said projections may be provided, each extending from a central portion of a side edge of said bottom surface of said electronic component. If the component comprises a base portion and a cover portion fitted over said base portion, said projection may extend from a central portion of a face of said base portion which is included in said bottom surface of said electronic component, or alternatively a plurality of said projections may each extend from a central portion of a side edge of said cover portion which is included in said bottom surface of said electronic component. In the first case, said projection may be hollowed out so as to contribute to the internal space within said electronic component. And, according to the most general method aspect of the present invention, these and other objects are attained by a mounting method for securing a surface mounted type electronic component to a printed circuit board with a circuit portion thereon, said component including at least one terminal protruding from a bottom surface thereof and terminating in a foot portion for being soldered to said printed circuit board and comprising a projection extending from said bottom surface of said electronic component for a distance somewhat less than the amount by which said terminal projects from said bottom surface, wherein said projection is provisionally secured by adhesive to said printed circuit board with said foot portion of said terminal overlaying said circuit portion, and then subsequently said foot portion of said terminal is soldered to said circuit portion. Again, in this method, the end portion of said projection may be roughened, and said projection may extend from a central portion of said bottom surface of said electronic component, or may be provided in plurality, each such projection extending from a central portion of a side edge of said bottom surface of said electronic component. In the case of said component comprising a base portion and a cover portion fitted over said base portion, said projection may extend from central portion of a face of said base portion which is included in said bottom surface of said electronic component, or alternatively, when provided in plurality, each said projection may extend from a central portion of a side edge of said cover portion which is included in said bottom surface of said electronic component. The adhesive may be a thermosetting adhesive which is cured by heat, or may be an ultraviolet light setting type adhesive which is cured by shining ultraviolet light thereon.

Thus, according to the present invention both in its structural aspect and in its method aspect, the electronic component may be provisionally bonded to the printed circuit base board by the projection or projections provided on the surface of the casing facing said printed circuit base board. Therefore, because of this provisional bonding, the terminal or terminals of the electronic component will not come away from the portions of the circuit on said printed circuit base board to which they are to be connected, during the soldering process when the assembly is being passed through the heating oven. Furthermore, the provision of substantial distance between the electronic component and the printed circuit base board, due to the substantial length of the projection, ensures of a good heat dissipation effect. And, even if some thermal stress and deformation are set up when the apparatus is being used and the electronic component is generating heat due to difference between the coefficients of thermal expansion of the casing of said electronic component and of the printed circuit board, this deformation can be properly absorbed due to the considerable length of the leg portions of the terminals, extending between the printed circuit base board and the body of the electronic component. Thus, such thermal stress and deformation are not allowed to lead to such excessive force being exerted on the portions of the printed circuit pattern on said printed circuit board to which the terminal foot portions are fixed, as to cause said printed circuit portions to become peeled away from the base circuit board, or to become fractured or interrupted, or as to cause cracking or fracture of the electronic component itself. Also, this structure and method are particularly suitable for securing the electronic component to the reverse or back side of a two surface mounting type printed circuit board.

BRIEF DESCRIPTION OF THE DRAWINGS

The present invention will now be described with respect to the preferred embodiments thereof, and with reference to the illustrative drawings appended hereto, which however are provided for the purposes of explanation and exemplification only, and are not intended to be limitative of the scope of the present invention in any way, since this scope is to be delimited solely by the accompanying claims. With relation to the figures, spatial terms are to be understood as referring only to the orientation on the drawing paper of the illustrations of the relevant parts, unless otherwise specified; like reference numerals, unless otherwise so specified, denote the same parts and gaps and spaces and so on in the various figures relating to one preferred embodiment, and like parts and gaps and spaces and so on in the figures relating to different preferred embodiments; and:

DESCRIPTION OF THE PREFERRED EMBODIMENTS

The present invention will now be described with reference to the preferred embodiments thereof, and with reference to the figures.

THE FIRST PREFERRED EMBODIMENT

Figure 2:
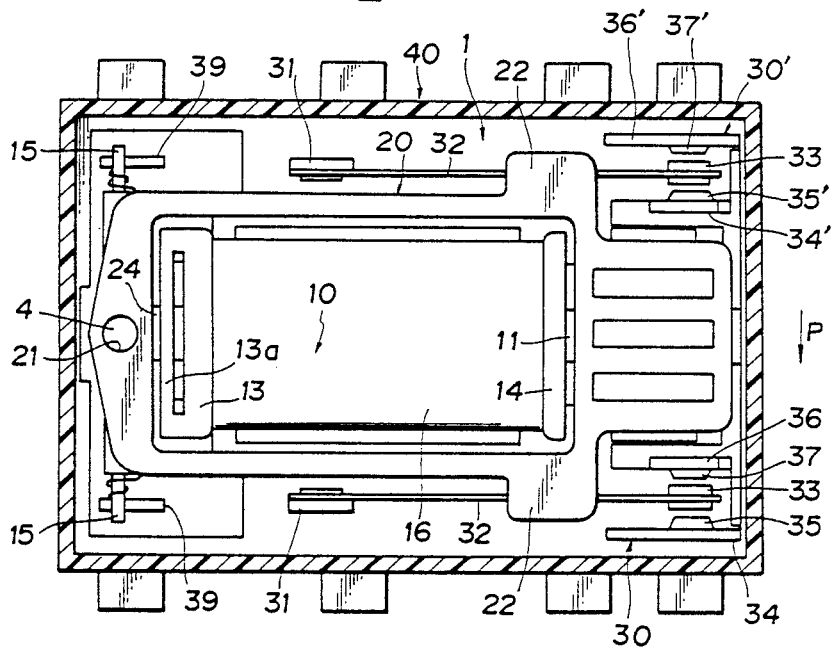
FIG. 2 is a plan view of said relay exemplifying said first preferred embodiment mounting structure, shown with its cover removed.
Figure 3:
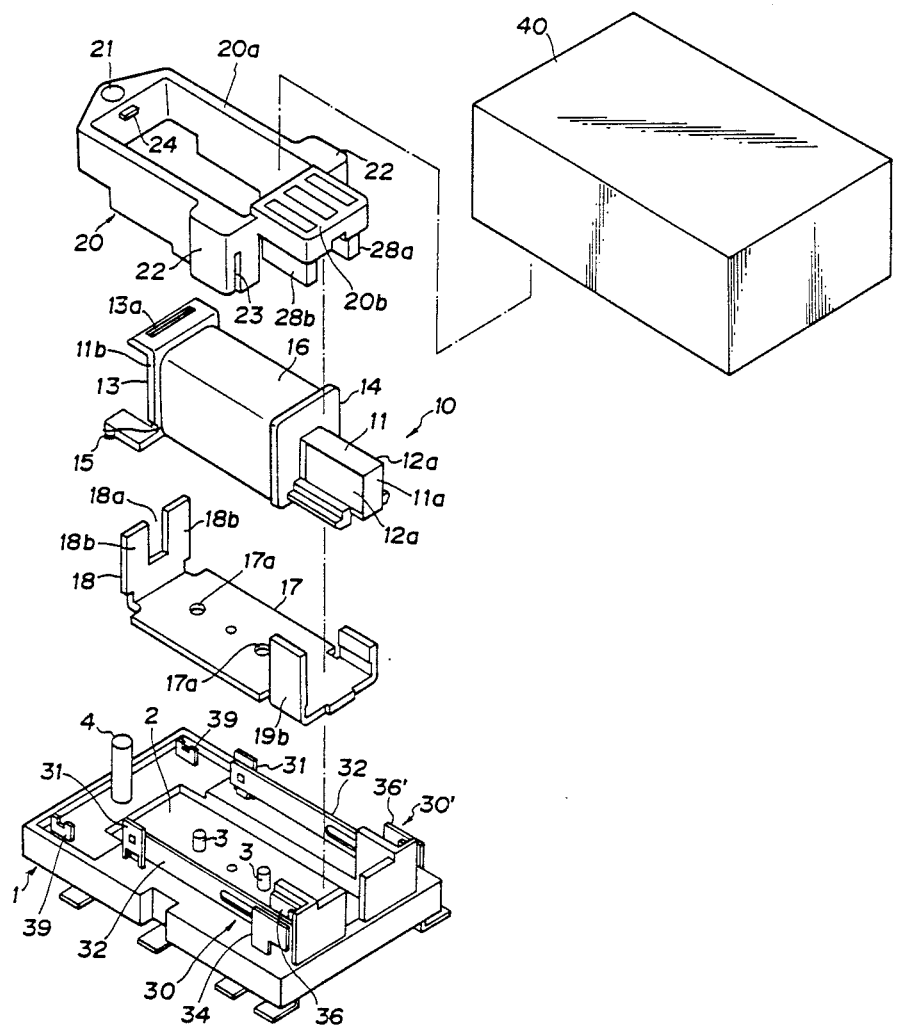
FIG. 3 is an exploded perspective view of said relay with said first preferred embodiment mounting structure.

A multi pole type surface mounted type relay incorporating the first preferred embodiment of the mounting structure of the present invention, and suitable for being mounted according to the first preferred embodiment of the mounting method of the present invention, is shown in plan view in FIG. 2 and in exploded sectional view in FIG. 3; it comprises a main base member 1 which is formed with a depression 2 in the central portion of its upper surface, a yoke member 17 resting and fixed in said depression 2, an electromagnet assembly generally designated as 10 fitted to said yoke member 17, an armature assembly 20, which is formed generally as a hollow rectangular assembly around said armature assembly 20 and said yoke member 17 and which can move to and fro in a pivoting motion, contact mechanisms 30 and 30' fixed to the base member 1 and actuated by the pivoting movement of the armature assembly 20, and a cover 40.

In more detail, the electromagnet assembly 10 comprises a bar shaped iron core member 11 which is fitted with flanges 13 and 14 made of resin by insert molding, and a coil 16 is wound around said iron core member 11 between the flanges 13 and 14. The ends of the coil 16 are connected to intermediate coil terminals 15 which are fixedly secured to the flange 13. The yoke member 17 is formed with a central flat bar shaped portion, with a turned up end portion 18 located at one end of said central bar portion and formed with two vertically extending fork portions 18b flanking a slot 18a, and with, located at the other end of said central bar portion and at one side thereof, a turned up side portion 19b. And the electromagnet assembly 10 is fitted onto said yoke member 17, with the coil 16 thereof fitting over the central bar portion of said yoke member 17, with the one end 11a of the iron core member 11 fitted as confronting the turned up side portion 19b of said yoke member 17 as will be explained shortly, and with the other end 11b (not shown in the drawings) of said iron core member 11 fitted into the slot 18a between the two fork portions 18b and either wedged therebetween by press forming said fork portions 18b inwards or fixed to them by laser welding. And the combination of the yoke member 17 and the electromagnet assembly 10 is fitted into the depression 2 of the base 1 and fixed therein, with two peg shapes 3 formed on the inner surface of said depression 2 of said base 1 fitting into two holes 17a formed in said central bar portion of said yoke member 17, and then while in this position the ends of the two intermediate coil terminals 15 are soldered into notches formed in the upper sides of two intermediate terminals 39 which are insert molded into the base 1, so as to provide electrical connection from outside to the coil 16 of the electromagnet assembly 10.

The armature assembly 20 is made up from an armature frame member 20a, two armature pieces 28a and 28b fitted thereto, and a magnet piece 29. In more detail, the armature frame member 20a is generally formed as a hollow rectangular member, and in one end of said hollow rectangular armature frame member 20a there is formed a vertically extending hole 21. A post member 4 is fixedly mounted on and extends vertically up from one end of the base 1, opposite the end 11b of the iron core member 11 of the electromagnet assembly 10, and the armature frame member 20a is pivotably fitted over said post member 4 by said hole 21, so as to be able to turn to and fro around said post member 4 to a certain extent in a plane generally parallel to the base member 1. To and vertically downwardly projecting from the under side of a projection portion 20b at the other end of the armature frame member 20a from the hole 21 there are fitted by insert molding the two armature pieces 28a and 28b, and a permanent magnet element (not shown in the figures) is laid against said under side of said projection portion 20b so as to bridge between said two armature pieces 28a and 28b. And on either side of this armature piece assembly there are provided projecting arm portions 22 which have downwardly facing slots 23 formed in them, for actuating contacts as will be described shortly. And, when fitted, this armature assembly 20 is prevented from coming off from the post member 4, by an inwardly extending projection 24 from the armature frame member 20a near the hole 21 thereof being fitted under an outwardly extending projection 13a from the flange 13 of the electromagnet assembly 10. Thus, in this fitted position, the armature frame member 20a substantially surrounds the electromagnet assembly 10 while being able to turn around the post member 4 through a certain limited and sufficient angle, and the two armature pieces 28a and 28b lie on opposite sides of the end 11a of the iron core 11 of said electromagnet assembly 10, on the opposite sides of which core member end 11a there are bondedly mounted magnetic shield plates 12a and 12b; in fact, the armature piece 28b lies between the magnetic shield plate 12b and the upwardly projecting turned up side portion 19a of the yoke member 17, while the not shown permanent magnet element lies on top of the end 11a of the iron core member 11.

The contact mechanisms 30 and 30' are located on opposite sides of the base 1, and, as best seen in the plan view of FIG. 2, each comprises: a fixed terminal 31 insert molded into the base 1; a springy member 32 one end of which is fixed to said fixed terminal 31 and which has a longitudinal slot formed in its other end; contact pieces 33 fixed on both surfaces of said other end of said springy member 32; a fixed terminal 34 or 34' mounted through the base 1 by insert molding and extending to the outside and projecting inwardly to lie on the lower side in the figures of said other end of said springy member 32 and having a normally closed contact piece 35 or 35' mounted to its upper side so as to oppose and to cooperate with the one of said contact pieces 33 mounted on the lower side in the figures of said springy member 32; another fixed terminal 36 or 36' mounted through the base 1 by insert molding and extending to the outside and projecting inwardly to lie on the upper side in the figures of said other end of said springy member 32 and having a contact piece 37 or 37' mounted on its lower side so as to oppose and to cooperate with the one of said contact pieces 33 mounted on the upper side of said springy member 32. And the slot 23 of each of the projecting portions 22 of the armature assembly 20 is engaged over the corresponding said springy member 32 so as, when said armature assembly 20 pivots on the post member 4, to drive said springy members 32 in the one direction or the other, thereby to engage the corresponding pairs of contact pieces 33 and 35, or 35 and 37, as will be easily understood based upon the above description and the figures.

Figure 1:
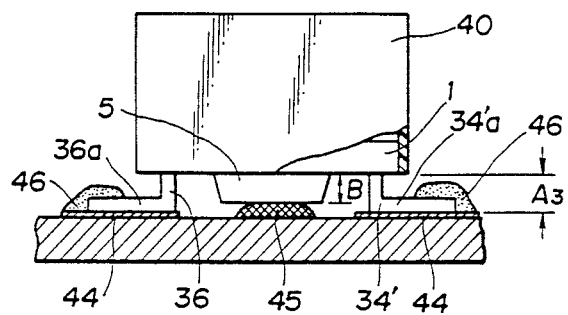
FIG. 1 is a side view showing a surface mounted relay to which the first preferred embodiment of the mounting structure of the present invention is applied in its state of being mounted to a printed circuit board.

This relay functions as follows. If no actuating electrical energy is supplied via the terminals 39 to the coil 16, then the armature assembly 20 is rotated in the direction indicated by the arrow "P" in FIG. 2 by the magnetic force of the permanent magnet element not shown in the figures, so as to cause the armature piece 28b to contact the upwardly protruding portion 19a of the yoke member 17, and so as thereby to cause the contact mechanism 30 to be switched so as to contact its one contact piece 33 to the contact piece 35 of its terminal 34, thereby connecting together its terminals 31 and 34 while isolating its terminal 36; and the contact mechanism 30' is similarly switched so as to connect together its terminals 31 and 34' while isolating its terminal 36', as shown in FIG. 1. On the other hand, when actuating electrical energy is supplied in the appropriate electrical polarity via the terminals 39 to the coil 16, then the magnetic force induced in the yoke member 17 by said coil 16 creates "N" poles on the pole surfaces on the free end 11a of the iron core member 11 which repel the armature piece 28a while attracting the armature piece 28b, and this causes the armature assembly 20 to be rotated in the direction opposite to that one indicated by the arrow "P" in FIG. 2 so as to cause the armature piece 28b to be moved away from the upwardly protruding portion 19a of the yoke member 17 and to contact the plate 12b fitted on said end 11a of said iron core member 11, which causes the contact mechanism 30 to be switched so as to contact its one contact piece 33 to the contact piece 37 of its terminal 36 while removing its other contact piece 33 from the contact piece 35 of its terminal 34, thereby connecting together its terminals 31 and 36 while isolating its terminal 34; and the contact mechanism 30' is similarly switched so as to connect together its terminals 31 and 36 while isolating its terminal 34. Further, when the supply of actuating electrical energy via the terminals 39 to the coil 16 is terminated, then the original switched condition of the relay is restored.

According to the construction of the relay as described above, since the armature assembly 20 is so disposed as to surround the exterior of the electromagnet assembly 10 and to be switched by turning through a relatively small angle about the post member 4, the overall height of the relay away from the printed circuit board to which it is fitted is minimized, and the relay accordingly is well adapted to the other component parts that are fitted on the same printed circuit board. Additionally, the fact that the core 16 is wound directly onto the iron core member 11 contributes to the reduction of the height of the relay. Furthermore, since the armature assembly 20 is constructed on the basis of the armature frame member 20a, it has a relatively high rigidity, and the fact that the post member 4 can be made relatively long improves the stability of the action of the opening and closing of the relay. Yet further, since the contact pieces 33 and the intermediate terminals 31, 34a and 34b are mounted after the terminals are insert molded with the base 1, organic gases which may be produced in the course of resin molding are not prone to adhere to the contacts, and accordingly the reliability of the contacts is improved. This relay is described, and claimed, in copending patent application Ser. No. 871,287, to which reference should be made, if required.

Particularly referring to FIG. 1 which shows this relay in side view as fixed to a printed circuit board, the terminals 34, 34', 36, and 36', as well as the terminals 31, 31', and 39 which do not appear in this figure, project downwards through the base 1 of the relay and protrude out therefrom for a certain determinate distance denoted as A3 to constitute terminal leg portions, and are then bet around through approximately right angles to form foot portions 34a, 34'a, 36a, 36'a, etc. Particularly according to one aspect of the structure concept of the present invention, on the central portion of the surface of the base 1 of the relay which faces towards the printed circuit board denoted herein as 43, there is formed a projection 5, having a height from said surface of said relay base 1 slightly less than said distance A3 which is the effective height of said terminal leg portions. And, although it is not particularly so shown in the figures, the end surface of this projection 5 is formed as somewhat coarsened in texture.

Thus, particularly according to one aspect of the method concept of the present invention, when this component 41 is to be mounted to the printed circuit base board 43 of FIG. 1 having the printed circuit portions 44 formed thereon, first the roughened end surface of the projection 5 of the relay base 1 is provisionally secured by a bonding agent portion 45 to an appropriate position on said printed circuit base board 43, with the foot end portions 36a, 34a, etc. of the terminals 36a, 34 overlaying and substantially touching the appropriate portions 44 of the printed circuit on said printed circuit base board 43 which it is desired to secure them to. This is possible because, as specified above, the height of the projection 5 from the surface of the relay base 1 is slightly less than the distance A3 which is the effective height of the terminal leg portions. Next, solder paste is smeared over the foot end portions 36a, 34a, etc. of the terminals 36a, 34, etc., so as to lay down solder paste smears 46 as shown in FIG. 1, and then the whole assembly is passed through a heating oven so as to melt the solder paste smears 46 into solder and so as to bond said terminal foot portions 36a, 34a, etc. to said printed circuit portions 44. When this happens, although the solder paste smears 46 become melted and thereby lose any adhesive properties they may have initially possessed, nevertheless, because the projection 5 is well provisionally secured by the bonding agent portion 45, which securing is particularly aided and facilitated by the fact that the end surface of the projection 5 is roughened, therefore there is no danger of the electronic component becoming displaced from its proper position, or of the terminal foot portions 36a, 34a, etc. becoming undesirably displaced from the printed circuit portions 44 so as not to be properly soldered thereto.

Accordingly, it is seen that this mounting structure for a surface mounted type electronic component, and this method for mounting a surface mounted type electronic component, are capable of guaranteeing good and reliable connection of the terminal portions of the electronic component to the printed circuit base board, without any risk of poor attachment of said terminal portions; and that they do this by allowing for provisional fixing in place of the electronic component to the printed circuit base board, before final soldering of the terminals thereof to their corresponding printed circuit portions thereon. Thus, this mounting structure and this mounting method ensure that neither the electronic component, nor the printed circuit on the base board nor the base board itself, are subjected to undue stress or deformation; and further good heat dissipation is allowed for. And it will be seen that this mounting structure for a surface mounted type electronic component, and this method for mounting a surface mounted type electronic component, are particularly suitable for use in the case of fixing such surface mounted type electronic components to both sides of a printed circuit base board.

A particular feature of the shown first preferred embodiment as detailed above is that the projection 5 can be made hollow, so as to enlarge the size of the corresponding depression 2 in the central portion of the upper surface of the base member 1 of the relay. This allows for more space for mounting the internal components of the relay such as the yoke member 17 and the electromagnet assembly 10, and aids with making the relay more compact and of lower profile.

THE SECOND PREFERRED EMBODIMENT

Figure 4:
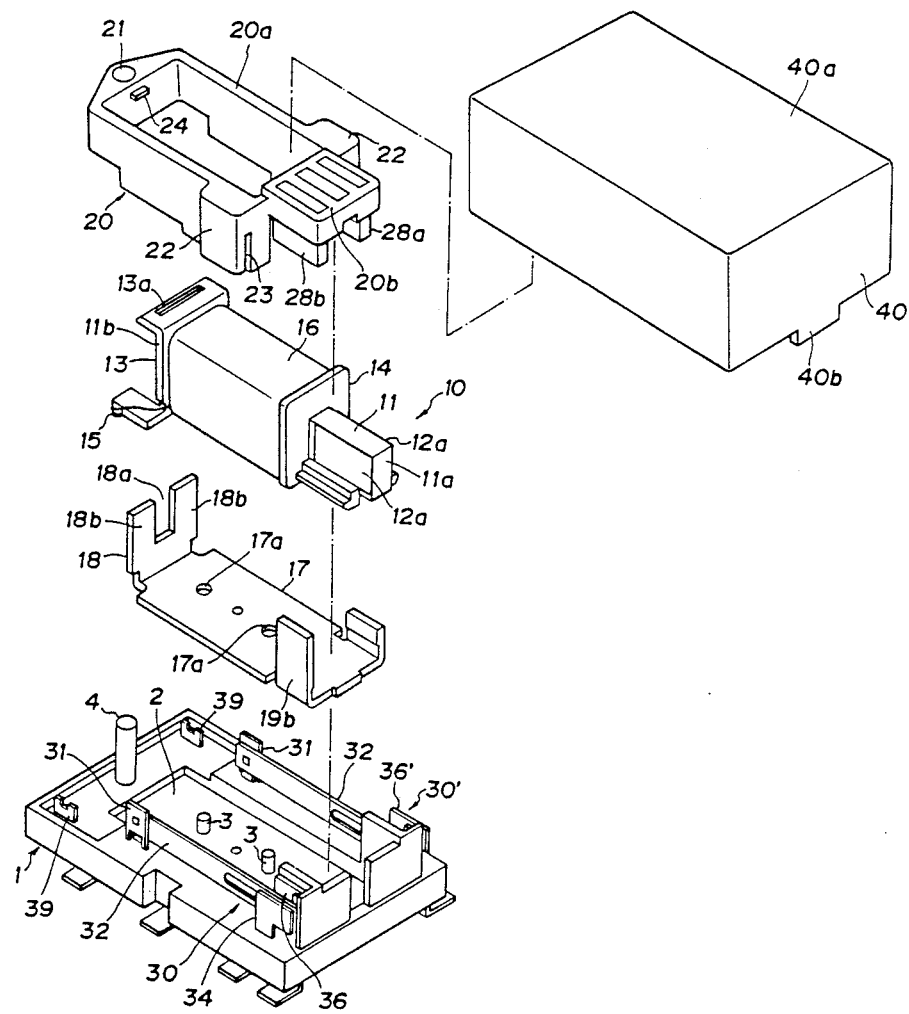
FIG. 4, similarly to FIG. 3 for the first preferred embodiment, is an exploded perspective view of a surface mounted relay to which the second preferred embodiment of the mounting structure of the present invention is applied.
Figure 5:
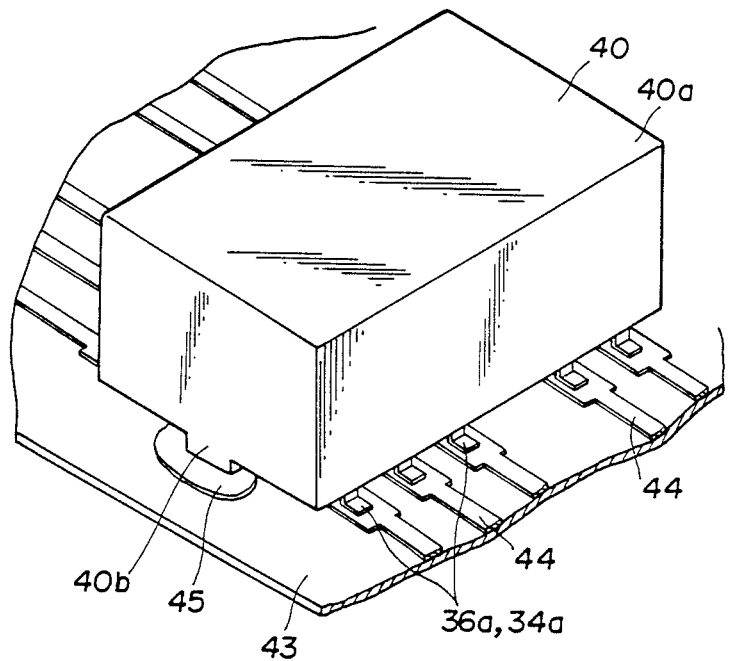
FIG. 5 is a perspective view, showing said surface mounted relay exemplifying said second preferred embodiment mounting structure in its state of being mounted to a printed circuit board.
Figure 6:
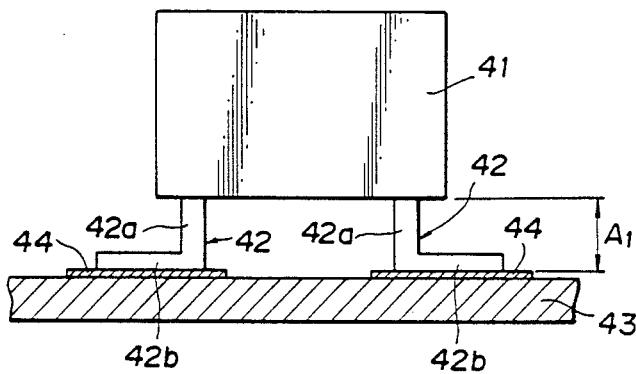
FIG. 6, similarly to FIG. 1 for the first preferred embodiment, is a view showing how a first type of prior art surface mounted relay is mounted to a printed circuit board.
Figure 7:
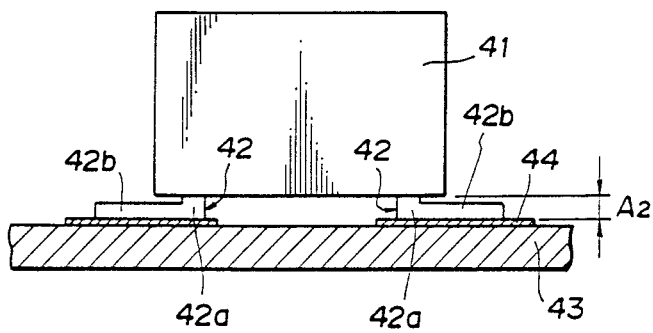
FIG. 7, similarly to FIG. 1 for the first preferred embodiment and to FIG. 6, is a view showing how a second type of prior art surface mounted relay is mounted to a printed circuit board.

A multi pole type surface mounted type relay incorporating the second preferred embodiment of the mounting structure of the present invention, and suitable for being mounted according to the second preferred embodiment of the mounting method of the present invention, is shown in exploded sectional view in FIG. 4, in a similar manner to FIG. 3 relating to the first preferred embodiment, and is shown in perspective view as fixed to a printed circuit base board 43 in FIG. 5; and, in FIGS. 4 and 5, like reference numerals to those in FIGS. 3 and 1 respectively denote like parts and features.

In this second preferred embodiment, the base 1 of the relay is not formed with any downwardly and outwardly extending projection like the projection 5 of the first preferred embodiment. On the other hand, the casing assembly 40 of the relay, which can be made by molding a transparent resin such as epoxy resin to which a quantity of a white powder such as $TiO_2$ is added, is formed with a pair (in this particular construction) of projections 40b which extend downwardly from its main body portion 40a which covers over the internal components of the relay. In fact, the outer periphery of the open end of said main body portion 40a of the casing 40 fits around the peripheral edge of the base 1 of the relay, so that the projections 40b protrude downwards from the central portion of either end edge of the face of the completed relay, again as in the case of the first preferred embodiment described above to a height from the surface of the relay base 1 facing towards the printed circuit board 43 which is slightly less than the effective height of the leg portions of the terminals 36a, 34'a, etc. before they are bent round to form their foot portions.

Thus, particularly according to the second preferred aspect of the method concept of the present invention, when this component is to be mounted to the printed circuit base board 43 of FIG. 5 (and this securing may be to the reverse or back side of said printed circuit base board 43) having the printed circuit portions 44 formed thereon, first the end surfaces of the projections 40b of the relay cover 40 are provisionally secured by bonding agent portions 45 to appropriate positions on said printed circuit base board 43, with the foot end portions 36a, 34a, etc. of the terminals 36a, 34 overlaying and substantially touching the appropriate portions 44 of the printed circuit on said printed circuit base board 43 which it is desired to secure them to. Again, this is possible because the height of the projections 41b from the surface of the relay base 1 is slightly less than the effective height of the terminal leg portions. If the bonding agett is of a thermosetting type such as thermosetting epoxy resin, then the whole assembly may be passed through a heating oven to heat and cure said bonding agent portions 45. Next, the foot end portions 36a, 34a, etc. of the terminals 36a, 34, etc., are bonded by soldering to said printed circuit portions 44, for example by being smeared with solder paste and passed through a heating oven, as described above with regard to the first preferred embodiment. When this happens, again, although the solder paste smears become melted and thereby lose any adhesive properties they may have initially possessed, nevertheless, because the projections 41b are well provisionally secured by the adhesive agent portions 45, therefore there is no danger of the electronic component becoming displaced from its proper position, or of the terminal foot portions 36a, 34a, etc. becoming undesirably displaced from the printed circuit portions 44 so as not to be properly soldered thereto.

Again, therefore, it is seen that this mounting structure and this mounting method for a surface mounted type electronic component are capable of guaranteeing good and reliable connection of the terminal portions of the electronic component to the printed circuit base board, without any risk of poor attachment of said terminal portions, by allowing for provisional fixing in place of the electronic component to the printed circuit base board, before final soldering of the terminals thereof to their corresponding printed circuit portions thereon. Thus, this mounting structure and this mounting method ensure that neither the electronic component, nor the printed circuit on the base board nor the base board itself, are subjected to undue stress or deformation; and further good heat dissipation is allowed for.

In the conceptual case (not according to the present invention) that a surface mounted type electronic component was being fixed to a printed circuit base board by its face nearest to said printed circuit base board being adhered thereto by bonding agent, then it would be appropriate to use a thermosetting bonding agent for the bonding agent portions, since an ultraviolet light setting type bonding agent could not be used since it would be inaccessible for radiation of ultraviolet light thereonto. However, in the case of the present invention as described above in which the projections 41b are utilized for being bonded to the printed circuit base board 43, it is very appropriate to utilize a bonding agent of the ultraviolet light setting type, and, by radiating ultraviolet light onto the portion of the bonding agent portions 45 which protrude on the side out of the gaps between the projections 41b and the printed circuit base board 43, substantially the whole of said bonding agent portions 45 may be hardened. Therefore, the applicability of the present invention is not to be considered as limited to thermosetting type bonding agents; on the contrary, bonding agents of the ultraviolet light setting type are very suitable for use with the present invention. This means that the curing process need not be a batch process, but can be an in line type process, and accordingly much greater productivity may be attained with such a bonding agent of the ultraviolet light setting type.

Although the present invention has been shown and described in terms of the preferred embodiments thereof, and with reference to the appended drawings, it should not be considered as being particularly limited thereby, since the details of any particular embodiment, or of the drawings, could be varied without, in many cases, departing from the ambit of the present invention. For example, although in the above disclosed preferred embodiments the application of the present invention to mounting a surface mounted type relay was exemplarily shown in other embodiments it would be possible for the present invention to be applied to mounting a surface mounted type capacitor, or a resistor or the like. Further, the number and the positions of the projections below the electronic component could be varied according to operational circumstances. Accordingly, the scope of the present invention is to be considered as being delimited, not by any particular perhaps entirely fortuitous details of the disclosed preferred embodiments, or of the drawings, but solely by the scope of the accompanying claims, which follow.

What is claimed is:

1. A mounting structure for a surface mounted type electronic component, comprising:

at least one terminal protruding from bottom surface thereof and terminating in a foot portion which is mounted on and soldered to a printed circuit board; and at least one projection extending from said bottom surface of said electronic component for a distance generally less than the amount by which said terminal projects from said bottom surface, wherein the projection has a bonding agent coupled thereto for allowing the projection to be provisionally bonded to the circuit board, wherein the terminal and the projection are positioned and extend toward the same surface of the printed circuit board.

2. A mounting structure for a surface mounted type electronic component according to claim 1, wherein the end portion of said projection is roughened.

3. A mounting structure for a surface mounted type electronic component according to claim 1, wherein said projection extends from a central portion of said bottom surface of said electronic component.

4. A mounting structure for a surface mounted type electronic component according to claim 1, wherein a plurality of said projections are provided, each extending from a central portion of a side edge of said bottom surface of said electronic component.

5. A mounting structure for a surface mounted type electronic component according to claim 2, said component comprising a base portion and a cover portion fitted over said base portion, wherein said projection extends from a central portion of a face of said base portion which is included in said bottom surface of said electronic component.

6. A mounting structure for a surface mounted type electronic component according to claim 4, said component comprising a base portion and a cover portion fitted over said base portion, wherein said projections each extend from a central portion of a side edge of said cover portion which is included in said bottom surface of said electronic component when the cover portion is fully fitted over the base portion.

7. mounting structure for a surface mounted type electronic component according to claim 5, wherein said projection is hollowed out so as to contribute to the internal space within said electronic component.

8. A mounting method for securing a surface mounted type electronic component to a printed circuit board with a circuit board with a circuit portion thereon, comprising the steps of:

providing at least one terminal protruding from a bottom surface thereof and terminating in a foot portion;

providing at least one projection extending from said bottom surface of said electronic component for a distance generally less than the amount by which said terminal projects from said bottom surface, wherein the projection has a bonding agent coupled thereto, and wherein the steps of providing the terminal and the projection comprises the steps of positioning and extending the terminal and the projection toward the same surface of the printed circuit board;

mounting said foot portion to said circuit portion;

provisionally securing the projection to said printed circuit board with said foot portion of said terminal overlaying said circuit portion; and thereafter soldering said foot portion to said circuit portion.

9. A mounting method for a surface mounted type electronic component according to claim 8 wherein the step of providing a projection comprises the step of providing a projection having a roughened end portion.

10. A mounting method for a surface mounted type electronic component according to claim 8, wherein the step of providing a projection comprises the step of providing a projection which extends from a central portion of said bottom surface of said electronic component.

11. A mounting method for a surface mounted type electronic component according to claim 8, wherein the step of providing a projection comprises the step of providing a plurality of said projections, each extending from a central portion of a side edge of said bottom surface of said electronic component.

12. A mounting method for a surface mounted type electronic component according to claim 9, further comprises the step of providing a base portion and a cover portion for the component fitted over said base portion, and wherein the step of providing a projection comprises the step of providing a projection which extends from a central portion of a face of said base portion which is included in said bottom surface of said electronic component.

13. A mounting method for a surface mounted type electronic component according to claim 11, further comprises the step of providing a base portion and a cover portion for the component fitted over said base portion, and wherein the step of providing said projections comprises the step providing said projections in which each extends from a central portion of a side edge of said cover portion which is included in said bottom surface of said electronic component when the cover portion is fully fitted over the base portion.

14. A mounting method for a surface mounted type electronic component according to claim 8, wherein the step of providing a projection having a bonding agent being a thermosetting adhesive which is cured by heat.

15. A mounting methiod for a surface mounted type electronic component according to claim 8, wherein the step of providing a projection having a bonding agent comprises the step of providing a projection having a bonding agent being an ultraviolet light setting typoe adhesive which is cured by shining ultraviolet light thereon.

16. A mounting structure for a surface mounted type electronic component, comprising:
- at least one terminal protruding from a bottom surface thereof and terminating in a foot portion which is mounted on and soldered to a printed circuit board; and
- at least one projection extending from said bottom surface of said electronic component for a distance generally less than the amount by which said terminal projects from said bottom surface, wherein the printed circuit board has a bonding agent coated thereon for allowing the projection to be provisionally bonded to the printed circuit board, wherein the terminal and the projection are positioned and extend toward the same surface of the printed circuit board.

17. A mounting method for securing a surface mounted type electronic component to a printed circuit board with a circuit portion thereon, comprising the steps of:
- providing at least one terminal protruding from a bottom surface of said component and terminating in a foot portion;
- providing at least one projection extending from said bottom surface of said electronic component for a distance generally less than the amount by which said terminal projects from said bottom surface, wherein the printed circuit board has a bonding agent coated thereon, and wherein the steps of providing the terminal and the projection comprises the steps of positioning and extending the terminal and the projection toward the same surface of the printed circuit board;
- mounting said foot portion to said circuit portion;
- provisionally securing the projection to said printed circuit board with said foot portion of said terminal overlaying said circuit portion; and thereafter
- soldering said foot portion to said circuit portion.

* * * * *